(12) United States Patent
Kuit

(10) Patent No.: US 7,136,147 B2
(45) Date of Patent: Nov. 14, 2006

(54) LITHOGRAPHIC APPARATUS AND DEVICE MANUFACTURING METHOD

(75) Inventor: Jan Jaap Kuit, Veldhoven (NL)

(73) Assignee: ASML Netherlands B.V., Veldhoven (NL)

(*) Notice: Subject to any disclaimer, the term of this patent is extended or adjusted under 35 U.S.C. 154(b) by 42 days.

(21) Appl. No.: 11/015,765

(22) Filed: Dec. 20, 2004

(65) Prior Publication Data

US 2006/0132732 A1 Jun. 22, 2006

(51) Int. Cl.
*G03B 27/42* (2006.01)
*G03B 27/58* (2006.01)
*G03B 27/62* (2006.01)

(52) U.S. Cl. .............. 355/53; 355/72; 355/75

(58) Field of Classification Search .......... 355/53, 355/72–76; 414/221.01, 217, 222.13, 935
See application file for complete search history.

(56) References Cited

U.S. PATENT DOCUMENTS

| | | | |
|---|---|---|---|
| 6,414,744 B1* | 7/2002 | Kuiper et al. ............ | 355/75 |
| 6,698,944 B1* | 3/2004 | Fujita ...................... | 396/611 |
| 6,712,577 B1* | 3/2004 | Davis et al. .............. | 414/217 |
| 6,930,762 B1* | 8/2005 | Yamada .................... | 355/75 |
| 7,009,683 B1* | 3/2006 | Sato ......................... | 355/53 |

* cited by examiner

Primary Examiner—Henry Hung Nguyen
(74) Attorney, Agent, or Firm—Pillsbury Winthrop Shaw Pittman, LLP

(57) ABSTRACT

The present invention relates to a lithographic apparatus including an illumination system configured to condition a radiation beam, a patterning device support constructed to support a patterning device, the patterning device being capable of imparting the radiation beam with a pattern in its cross-section to form a patterned radiation beam, a substrate support constructed to hold a substrate, and a projection system configured to project the patterned radiation beam onto a target portion of the substrate, wherein the lithographic apparatus includes an exchangeable object handling apparatus for exchanging an exchangeable object with an exchangeable object loading station and a support, the exchangeable object handling apparatus including three or more end-effectors each capable of exchanging an exchangeable object with one of the supports. Such lithographic apparatus is in particular suited for the streaming of subsequent double exposure jobs.

20 Claims, 3 Drawing Sheets

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that circumstance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In conventional lithographic apparatus, a patterning device handling apparatus may be provided to exchange a patterning device between the patterning device support on which the patterning device is positioned during the transfer of a pattern on a substrate, and a stationary loading station wherein one or more patterning devices can be placed. The patterning devices are exchanged between the loading station and the patterning device station to subsequently transfer the different patterns of the patterning devices on the substrates which are placed on a substrate support.

An important factor in the production capacity of a lithographic apparatus is the exchange time needed to take away a patterning device, which is located on the patterning device support, and place another patterning device on the patterning device support. During the time needed for this exchange, no pattern can be transferred on a substrate. In order to increase the capacity of the lithographic apparatus, it is important to decrease this exchange time.

In order to keep the exchange time small, the patterning device handling apparatus of a conventional lithographic apparatus includes a turret and a robot. The turret can hold at the same time two patterning devices in two different holding positions, whereby the turret can be rotated around its vertical axis so that one of the two holding positions can be turned to a position wherein the turret can exchange a patterning device with the patterning device support. In another position, usually when the turret is rotated over 180 degrees, a patterning device in the other of the two holding position can be exchanged with the patterning device support.

The patterning device handling apparatus further includes a robot to exchange a patterning device between a loading station and the turret, so that a patterning device held by the turret can be exchanged for another one.

In a so-called multiple exposure job, a batch of substrates is exposed to the patterns of two or more patterning devices. For example, in a double exposure job, first a pattern of a first patterning device is transferred to a batch of substrates, and subsequently a pattern of a second patterning device is transferred to each of the substrates.

However, in conventional exchangeable object handling apparatus, a seamless streaming of double exposure jobs, in particular subsequent double exposure jobs, may not be possible as more than one patterning device is needed per double exposure job.

SUMMARY

It is desirable to provide an exchangeable object handling apparatus for a lithographic apparatus which provides for a seamless streaming of exchangeable objects when one or more multiple exposure jobs are carried out.

According to an embodiment of the invention, there is provided a lithographic apparatus including: an illumination system configured to condition a radiation beam; a patterning device support constructed to support a patterning device, the patterning device being capable of imparting the radiation beam with a pattern in its cross-section to form a patterned radiation beam; a substrate support constructed to hold a substrate; and a projection system configured to project the patterned radiation beam onto a target portion of the substrate, wherein the lithographic apparatus includes an exchangeable object handling apparatus for exchanging an exchangeable object between an exchangeable object loading station and one of the supports, the exchangeable object handling apparatus including three or more end-effectors each capable of exchanging an exchangeable object with the one of the supports.

According to another embodiment of the invention, there is provided a device manufacturing method including, in an operational phase, providing a projection beam of radiation using an illumination system, using a patterning device placed on a patterning device support to impart the projection beam with a pattern in its cross-section, and projecting the patterned beam of radiation onto a substrate placed on a substrate table, and, in an exchanging phase, exchanging an exchangeable object between a support and a loading station using an exchangeable object handling apparatus including three or more end-effectors each capable of exchanging an exchangeable object with the support.

In an embodiment of the invention, there is provided a device manufacturing method including patterning a beam of radiation with a patterning device to form a patterned beam of radiation, the patterning device being supported by a patterning device support; projecting the patterned beam of radiation onto a substrate placed on a substrate support, and exchanging an exchangeable object between one of said supports and a loading station using an exchangeable object handling apparatus comprising three or more end-effectors each capable of exchanging an exchangeable object with one the supports.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
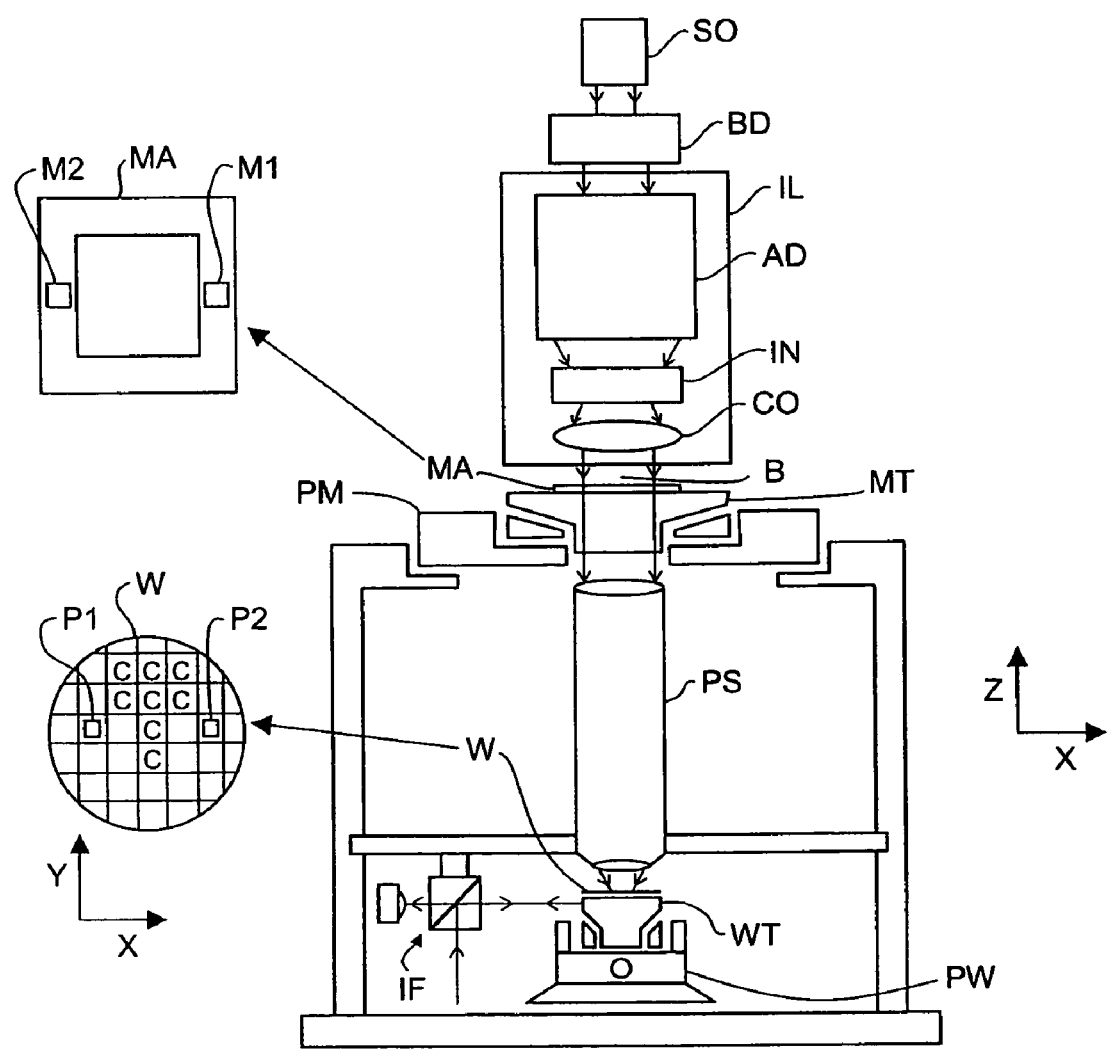
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable type of radiation) and a support structure (e.g. a mask table) MT constructed to support a patterning device (e.g. a mask) MA and connected to a first positioner PM configured to accurately position the patterning device in accordance with certain parameters. The apparatus also includes a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device or mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

Step mode: the mask table MT and the substrate table WT are kept essentially stationary, while an entire pattern imparted to the radiation beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

Scan mode: the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

Another mode: the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
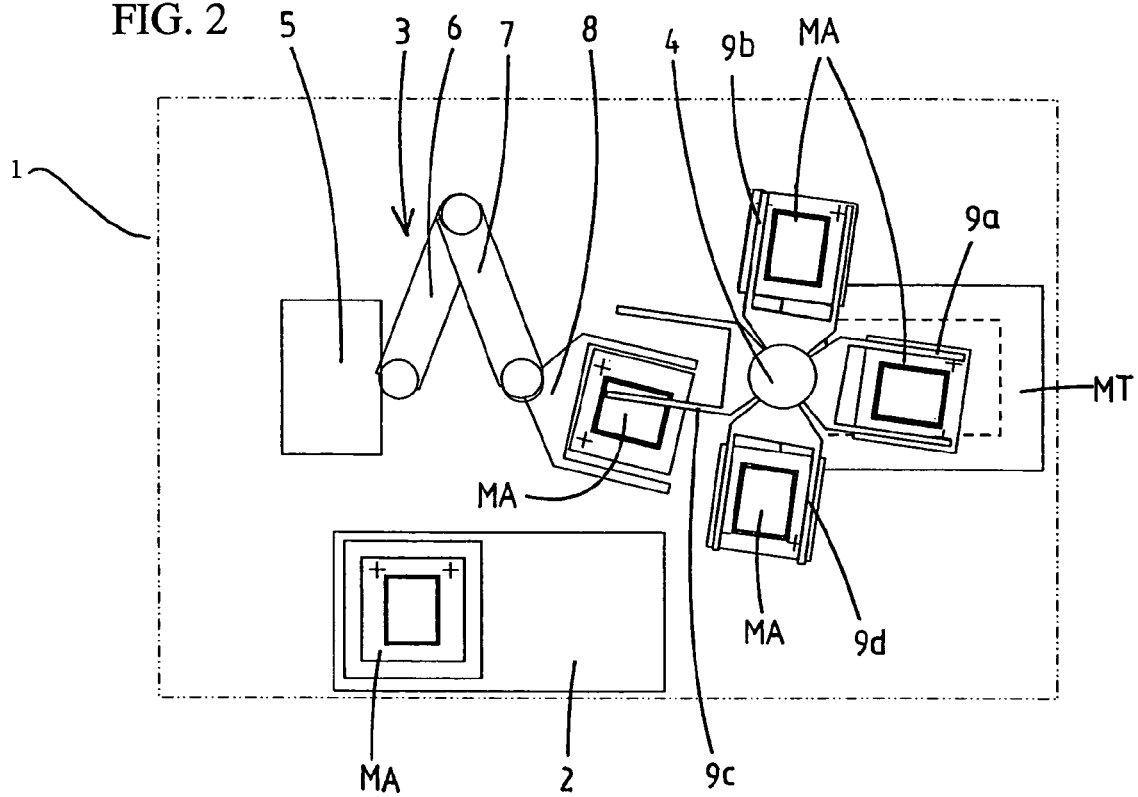
FIG. 2 depicts a top view of an exchangeable object handling apparatus according to an embodiment of the invention.

FIG. 2 shows a patterning device handling apparatus in accordance with an embodiment of the invention in general indicated with the reference number 1. The patterning device handling apparatus 1 is designed to exchange a patterning device between a patterning device support MT and a patterning device loading station 2.

The loading station 2 is a stationary station in which one or more patterning devices MA are stored before they are transferred by the patterning device handling apparatus 1 to the patterning device support WT. The patterning device handling apparatus 1 may also be suitable for exchanging a patterning device MA with any other station such as an inspection station, buffer station or a cleaning station. When a patterning device MA is directly transferred from such other station to the patterning device support MT, and thus not via the loading station 2, this other station is also regarded to be a loading station in the context of this application.

The patterning device handling apparatus 1 includes a robot 3 and a turret 4. The robot 3 includes a base part 5 which is movably connected to a proximal end of a robotic arm construction having two arms 6, 7 which are connected to each other by linkages, for example formed by servo axis. The distal end of the robot arm is provided with a robot end-effector 8 having suitable holding devices configured to hold one patterning device MA. These holding devices may include, for example, a mechanical, electrostatic, electromagnetic or vacuum gripping device. The robot 3 is capable of exchanging a patterning device MA with the turret 4 and with the patterning device loading station 2.

Figure 3:
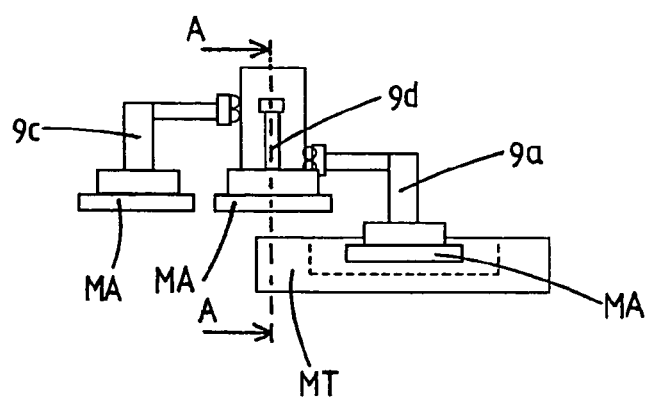
FIG. 3 depicts a side view of a part of the embodiment of FIG. 2.

The turret 4 includes four end-effectors 9a, 9b, 9c, 9d each being capable of exchanging a patterning device with the patterning device support MT and with the end-effector 8 of the robot 3. The four end-effectors 9a, 9b, 9c, 9d of the turret 4 are arranged at angles of substantially 90 degrees around a vertical axis of rotation A—A (FIG. 3). Each of the end-effectors 9a, 9b, 9c, 9d includes a suitable holding device for holding a patterning device, such as for example a mechanical, electrostatic, electromagnetic or vacuum gripping device.

Each of the end-effectors 9a, 9b, 9c, 9d may be movable in a vertical direction to bring one respective end-effector 9a in a lower position with respect to the other end-effectors 9b, 9c, 9d so that the patterning device MA held by the respective end-effector 9a can be placed on the patterning device support MT without the risk that one of the other end-effectors 5 interferes with the patterning device support MT. This vertical movement of the end-effectors 9a, 9b, 9c, 9d is more clearly shown in FIG. 3 wherein one of the end-effectors 9a is placed in a lower position to exchange a patterning device MA with the patterning device support MT. The respective end-effector 9a is thereby placed in a region which is lower than the region in which the other corresponding parts of the other three end-effectors 9b, 9c, 9d are located. In an embodiment of the invention, the region where the end-effector 9a is placed corresponds to a horizontal plane and the region where the other corresponding parts of the other three end-effectors 9b, 9c, 9d are located is also a horizontal plane.

The vertical movement of each of the end-effectors 9a, 9b, 9c, 9d may be effected by an actuator provided on each of the end-effectors 9a, 9b, 9c, 9d. It is also possible to provide stops for the end-effectors 9a, 9b, 9c, 9d, whereby in a downward movement of the turret 4 three of the end-effectors 9b, 9c, 9d are stopped by the stops and move upwardly with respect to the rest of the turret 4 so that the other end-effector 9a is moved in a position spaced from the region or horizontal plane through the other three end-effectors 9b, 9c, 9d.

In an alternative embodiment, a turret rotatable around a vertical axis may be used with three or more end-effectors each being rigidly arranged on the turret. The turret with the three or more end-effectors may be movable in a vertical direction to bring one of the end-effectors in a position in which an exchange of a patterning device with the patterning device support MT or the robot 2 is made possible. Any other suitable device for bringing at least one of the end-effectors 9a, 9b, 9c, 9d to a lower position may also be used.

In the case of two subsequent double exposure jobs, it is desirable to exchange four patterning devices within a short period. In principle, it would be possible to carry this out with a patterning device handling apparatus having two end-effectors, such as the robot-turret combination as described in the introductory part of this application. However, it is then each time required to transfer the patterning device within the illumination period of a wafer from the patterning device support MT to the loading station 2. A part of this transfer is carried out by the robot 3, which is relatively slow. The time needed for the transfer may often be longer than the illumination period, and as a result the use of the robot 3 may decrease the production capacity of the lithographic apparatus.

Thereby the robot 3 is often also used to carry out other tasks such as the transfer of patterning devices between the loading station 2 and inspection or cleaning stations. When two or more subsequent double exposure jobs are carried out using a conventional patterning device handling apparatus, there is often no time available to carry out these other tasks as the robot 3 is almost continuously used for the transfer of patterning devices between the loading station 2 and the turret 4.

On the contrary, when using a patterning device handling apparatus 1 with four end-effectors 9a, 9b, 9c, 9d the patterning devices MA for a next double exposure job can be transferred to the end-effectors 9a, 9b, 9c, 9d of the turret already before actual use. Therefore, during an exchange of a patterning device MA between the patterning device handling apparatus and the patterning device support for a next double exposure job, there is only an exchange between the turret and the patterning device support required. Due to the presence of the four end-effectors 9a, 9b, 9c, 9d the robot 3 is thus taken out of the critical time path. Furthermore, since the robot 3 is taken out of the critical time path, it is also possible to use the robot 3 for other tasks such as inspection and cleaning of a patterning device in the respective stations.

In the case of triple exposure jobs, the turret may have six end-effectors each being capable of exchanging a patterning device with the patterning device support MT. Accordingly, eight end-effectors may be provided for streaming quadruple exposure jobs, etc. In general the patterning device handling apparatus includes preferably at least four and an even number of end-effectors (thus two or more times two end-effectors) which each can exchange a patterning device MA with the patterning device support MT.

In case that subsequent single and double exposure jobs have to be streamed, it is also sufficient to provide a turret with three end-effectors in order to achieve the aim of the present invention.

The exchange of patterning devices MA for subsequent double exposure jobs may be carried out according to the following method. The robot 2 places subsequently a first and a second patterning device MA for a double exposure job in two of the end-effectors 9a, 9b, 9c, 9d of the turret 4. Then, the first patterning device MA is placed by the turret 4 on the patterning device support MT and the transfer of a pattern of the first patterning device MA on a first substrate W can be performed.

After the exposure of the first patterning device, this first patterning device MA is taken from the patterning device support MT and replaced by the second patterning device MA, and subsequently the first substrate W is exposed to a pattern of the second patterning device MA. After finishing the exposure of a pattern of the second patterning device on all the fields of substrate W, a new substrate W may be loaded on the substrate support WT and exposed to the pattern of the second patterning device MA. After the exposure of the second substrate W, the second patterning device is taken from the patterning device support MT by the turret 4 and replaced by the original first patterning device MA to expose the pattern of the first patterning device MA to the second substrate, thereby completing the double exposure job of the second substrate W.

In the meantime, the robot 3 may have loaded a third and a fourth patterning device MA out of the patterning device loading station 2 in the two end-effectors 9a, 9b, 9c, 9d not used for the first two patterning devices MA. This can typically be done during the exposure of the complete batch of wafers of the exposure job being processed so that the time needed for exchanging the first and second patterning device MA with the patterning device support MT between the first and second exposure jobs is kept to a minimum. After the first double exposure job is completed with the first and second patterning devices MA, the third and fourth patterning device MA may be subsequently placed on the patterning device support MT for the second double exposure jobs wherein a second batch of substrates is exposed to a pattern of the third and fourth patterning device MA.

During the single exposure periods (i.e. the operational phase in which a substrate is illuminated) of the second double exposure jobs, the robot 3 may take the first and second patterning devices MA of the first double exposure job out of the end-effectors 9a, 9b, 9c, 9d, of the turret 4 and place them back into the loading station 2. During the same periods the respective first and second end-effectors 9a, 9b, 9c, 9d of the turret 4 may be loaded with a fifth and sixth patterning device MA for a third double exposure job. These steps may be repeated until all subsequent double exposure jobs have been completed. Thereafter all patterning devices MA may be placed back in the patterning device loading station 2.

From this method, it is clear that the robot-turret combination with the turret 4 having four end-effectors 9a, 9b, 9c, 9d, makes a seamless streaming of double exposure jobs possible. However, it will be clear that the lithographic apparatus also makes it possible to make a seamless streaming of single and double exposure jobs or even single, double and triple exposure jobs possible, whereby in the latter case a triple exposure job is always preceded and followed up by a single exposure job.

In the method as described above the first and second patterning device are subsequently used to illuminate a first substrate and thereafter applied in a reverse order to illuminate a second substrate. In a next step, a third substrate could be illuminated in the "normal" order and the fourth substrate again in the reverse order, etc. In an alternative method each substrate is exposed to the pattern of a first and a second patterning device in the "normal" order. In this alternative method, a substrate and a patterning device may be exchanged for each exposure. In yet another less commonly used method, first a complete batch of substrates is exposed to the pattern of a first patterning device and subsequently the batch of substrates is exposed to the pattern of a second patterning device. All methods for carrying out double (or multiple) exposure jobs as described and any other suitable methods are deemed to fall within the scope of the present invention.

Figure 4:
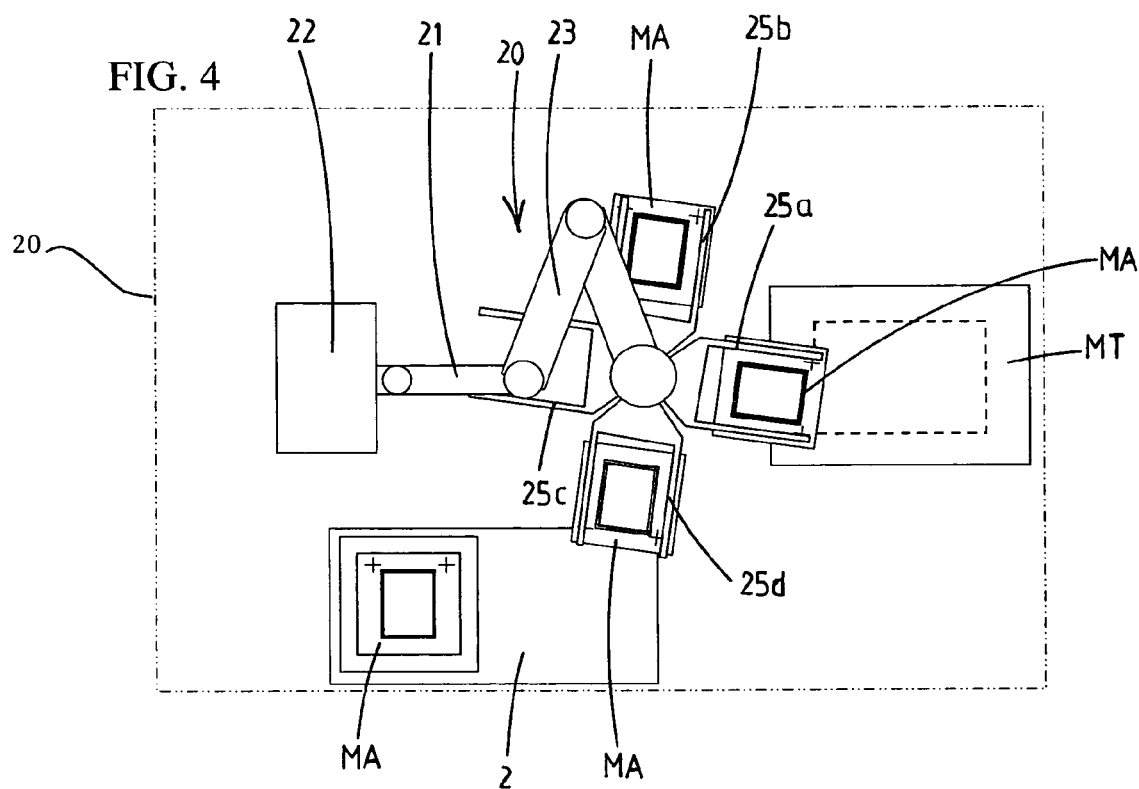
FIG. 4 depicts a top view of an exchangeable object handling apparatus according to an embodiment of the invention.

In FIG. 4, a patterning device handling apparatus in accordance with an alternative embodiment of the invention is shown, in general indicated with the reference number 20. The patterning device handling apparatus 20 includes a robot 21. The robot 21 is capable of exchanging a patterning device MA with the patterning device support MT and the loading station 2. The robot 21 includes a base part 22 which is movably connected to a proximal end of a robotic arm construction 23 having a number of arms which are connected to each other by linkages, for example formed by servo axis. The distal end of the robot arm construction 23 is provided with four end-effectors 25a, 25b, 25c, 25d each having suitable holding devices configured to hold one patterning device MA. These holding devices may include, for example, mechanical, electrostatic, electromagnetic, vacuum or any other suitable gripping device.

Each of the end-effectors 25a, 25b, 25c, 25d may be movable in a substantial vertical direction in order to bring one of the end-effectors 25a, 25b, 25c, 25d in a position spaced from the region or the horizontal plane in which the other end-effectors 25a, 25b, 25c, 25d are positioned. The vertical movement may be effected by actuators, stops or any other suitable means as described in relation with the embodiment in FIGS. 2 and 3.

The method as described in relation with the embodiment of FIGS. 2 and 3 may also be used for the patterning device handling apparatus 20 of FIG. 4 with the main difference that the four end-effectors 25a, 25b, 25c, 25d of the robot 21 directly exchange patterning devices with both the loading station 2 and the patterning device support MT.

In the above description two embodiments of the invention are described. In general any suitable manipulator can be used to exchange an exchangeable object between the loading station 2 and the patterning device support MT. The robot of FIGS. 2, 3 and 4 may be a multi-axis robot which in an efficient way can move the patterning device MA to the loading station 2 and the turret 4 or the patterning device support MT, respectively. A robot is defined as a manipulator including two or more arms, the two or more arms being movably, for example, rotatably connected to each other, whereby at least one end of the robot is designed to manipulate an object within a certain space.

The two embodiments described hereabove are related to the exchange of patterning devices. However, these embodiments or any other embodiment of the invention could also be used for the exchange of substrates between the substrate support (mask table) and a substrate loading station, or to exchange any other exchangeable object which is applied in a lithographic apparatus, such as an exchangeable object used in the optical path of the lithographic apparatus. Such exchangeable object handling apparatus for the exchange of a substrate, patterning device or any other exchangeable object used in a lithographic apparatus is deemed to fall within the scope of the present application.

Further, in the above-described embodiments of the substrate handling apparatus the support region of a substrate W present on the substrate support WT is a support plane that is horizontal, whereby the support plane is defined as the plane in which the bottom side of the substrate W is lying when it is supported on the substrate support WT. In some known substrate supports WT, this support plane is not horizontal but another direction, for example, vertical or slanting. In such embodiments the directions used would not be defined as vertical and horizontal but rather as perpendicular to or parallel to the support plane. Terms as higher and lower should in such case be understood as further or closer spaced with respect to the support plane in this direction perpendicular to the support plane.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5–20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
an illumination system configured to condition a radiation beam;

a patterning device support constructed to support a patterning device, the patterning device being capable of imparting the radiation beam with a pattern in its cross-section to form a patterned radiation beam;

a substrate support constructed to hold a substrate;

a projection system configured to project the patterned radiation beam onto a target portion of the substrate, and an exchangeable object handling apparatus configured to exchange an exchangeable object between an exchangeable object loading station and one of said supports, said exchangeable object handling apparatus comprising three or more end-effectors each capable of directly exchanging an exchangeable object with said one of said supports.

2. The lithographic apparatus of claim 1, wherein said exchangeable object handling apparatus includes an even number of end-effectors each capable of exchanging one exchangeable object with said one of said supports.

3. The lithographic apparatus of claim 1, wherein said exchangeable object handling apparatus comprises four end-effectors each capable of exchanging one exchangeable object with said one of said supports.

4. The lithographic apparatus of claim 1, wherein said three or more end-effectors are arranged substantially equally spaced around an axis of rotation of said exchanging handling apparatus.

5. The lithographic apparatus of claim 1, wherein said exchangeable object handling apparatus comprises a turret and a robot, said turret being configured to exchange an exchangeable object with said robot and said one of said supports and comprising said three or more end-effectors, said robot being designed to exchange an exchangeable object with said turret and said exchangeable object loading station.

6. The lithographic apparatus of claim 1, wherein said exchangeable object handling apparatus comprises a single robot to exchange an exchangeable object between said one of said supports and said exchangeable object loading station, said robot comprising said three or more end-effectors.

7. The lithographic apparatus of claim 1, wherein each of said three or more end-effectors is independently movable in order to place one of said three or more end-effectors in a region which is vertically spaced apart from a region in which the other of said three or more end-effectors are placed.

8. The lithographic apparatus of claim 7, wherein said regions are planes.

9. The lithographic apparatus of claim 1, wherein each of said three or more end-effectors is independently movable in a direction substantially perpendicular to a support region of said support, said support region being defined by a support structure of the support, constructed to support an exchangeable object.

10. The lithographic apparatus of claim 9, wherein said support region is a plane.

11. The lithographic apparatus of claim 1, wherein said lithographic apparatus comprises one or more further exchangeable object stations, with which said exchangeable object handling apparatus can exchange an exchangeable object.

12. The lithographic apparatus of claim 11, wherein said one or more further exchangeable object stations include a cleaning station, a buffer station or an inspection station.

13. The lithographic apparatus of claim 1, wherein said exchangeable object is said patterning device and said one of said supports is said patterning device support.

14. The lithographic apparatus of claim 1, wherein said exchangeable object is said substrate and said one of said supports is said substrate support.

15. The lithographic apparatus of claim 1, wherein said one of said supports is the patterning device support and is adapted to exchange the patterning device supported thereby with one on the exchangeable object loading station.

16. The lithographic apparatus of claim 1, further comprising an additional exchangeable object handling apparatus configured to exchange an exchangeable object with the other one of said supports wherein both said exchangeable object handling apparatus and said additional exchangeable object handling apparatus comprise three or more end-effectors each capable of exchanging an exchangeable object with the respective support.

17. A device manufacturing method comprising:

patterning a beam of radiation with a patterning device to form a patterned beam of radiation, said patterning device being supported by a patterning device support;

projecting the patterned beam of radiation onto a substrate placed on a substrate support, and exchanging an exchangeable object between one of said supports and a loading station using an exchangeable object handling apparatus comprising three or more end-effectors each capable of directly exchanging an exchangeable object with said one of said supports.

18. The method of claim 17, wherein said one of said supports is the patterning device support and exchanges the patterning device supported thereby with one on the exchangeable object loading station.

19. The method of claim 17, wherein said exchangeable object is said substrate and said one of said supports is said substrate support.

20. The lithographic apparatus of claim 1, wherein at least one of said three or more end-effectors is configured to move relative to the remaining of said three or more end-effectors along a direction that is substantially perpendicular to a support region of said support, said support region constructed to support the exchangeable object.

* * * * *